Figure 1:
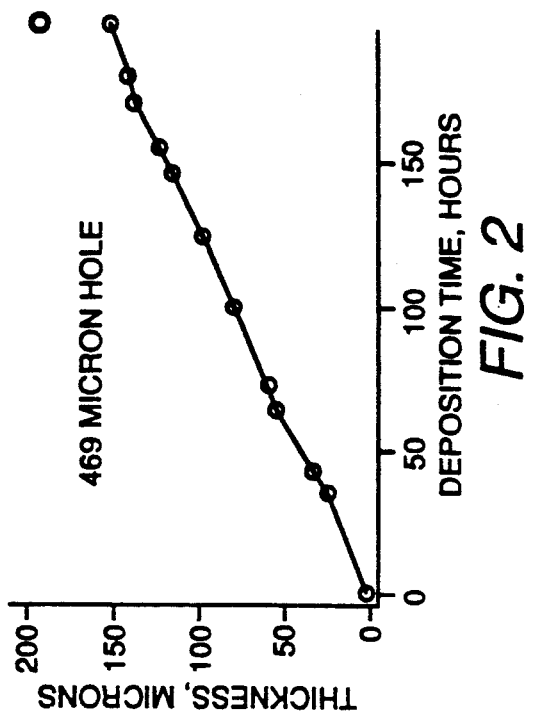

United States Patent [19]

Anthony et al.

[11] Patent Number: 5,300,313
[45] Date of Patent: Apr. 5, 1994

[54] METHOD FOR DETERMINING THICKNESS OF CHEMICAL VAPOR DEPOSITED LAYERS

[75] Inventors: Thomas R. Anthony, Schenectady; James F. Fleischer, Scotia; David W. Woodruff, Clifton Park, all of N.Y.

[73] Assignee: General Electric Company, Schenectady, N.Y.

[21] Appl. No.: 991,798

[22] Filed: Dec. 16, 1992

[51] Int. Cl.⁵ .................. C23C 16/00; C23C 16/26
[52] U.S. Cl. ........................ 427/9; 427/248.1; 427/249
[58] Field of Search ............ 427/9, 249, 248.1; 118/712

[56] References Cited

U.S. PATENT DOCUMENTS

| | | | |
|---|---|---|---|
| 2,726,173 | 12/1955 | Martin | 118/712 X |
| 4,427,711 | 1/1984 | Martin | 427/10 |
| 4,466,872 | 8/1984 | Einbinder | 427/9 X |
| 5,131,752 | 7/1992 | Yu et al. | 427/10 X |
| 5,204,144 | 4/1993 | Cann et al. | 427/569 |

*Primary Examiner*—Mark L. Bell
*Assistant Examiner*—David R. Sample
*Attorney, Agent, or Firm*—William H. Pittman

[57] ABSTRACT

The thickness of a layer of material deposited by chemical vapor deposition, especially a diamond layer, is monitored by providing at least one substrate on which the material is deposited, with at least one perforation of a predetermined size therein. The relationship between the thickness of the layer formed in said perforation and the thickness of the layer formed on the substrate surface is determined, so that the thickness of the surface layer can be determined from the thickness of the layer formed in the perforation.

7 Claims, 1 Drawing Sheet

METHOD FOR DETERMINING THICKNESS OF CHEMICAL VAPOR DEPOSITED LAYERS

This invention relates to the production of diamond and other materials by chemical vapor deposition, and more particularly to the deposition of diamond layers of a predetermined thickness.

Chemical vapor deposition (hereinafter sometimes "CVD") is employed for producing a number of materials. Its use to produce diamond at high temperature and low pressure from a mixture of hydrogen and a hydrocarbon gas is a method of increasing importance for the production of industrial diamond. The CVD diamond procedure is particularly useful for producing layers of diamond which can be fabricated into such items as heat sinks for electronic applications. Diamond, having a very high thermal conductivity, is particularly useful as a raw material for such heat sinks.

The thickness tolerances required for heat sinks are usually very close. For example, a typical heat sink material may be on the order of 0.3-0.4 mm. in thickness and substantial deviation from the prescribed thickness is not tolerated.

In a typical CVD diamond operation, a layer of diamond is deposited on a substrate, typically molybdenum, by high temperature (e.g., microwave or hot filament) activation of a mixture of hydrogen and a hydrocarbon such as methane. The rate of diamond deposition on the substrate varies widely from run to run, and the time period required to deposit a layer of useful thickness may be many days since the typical deposition rate is on the order of 10-15 microns per day.

The production of diamond layers of predetermined thickness has been difficult because, in order to prepare a suitable monolithic diamond layer, it is necessary to conduct the CVD operation uninterrupted, and there is no accurate way to monitor thickness during the deposition operation. As a result, it may be necessary to continue deposition for a period longer than that required to produce the desired thickness. Such continuation is not fatal, since the diamond sheet can be removed from the substrate and machined to the desired thickness. However, this is wasteful of both time and energy. On the other hand, cessation of the deposition operation before the desired thickness has been attained is fatal and it may be necessary to discard the diamond thus deposited.

It is, therefore, extremely desirable to develop a method for determining the thickness of a layer of CVD-deposited material during the deposition operation. Such a method is provided by the present invention.

The invention in one of its aspects is a method for depositing a layer of material of a specific desired thickness on the surface of at least one substrate by chemical vapor deposition which comprises:

mounting said substrate or substrates in chemical vapor deposition apparatus so that at least one perforation of a predetermined size exists in the plane of said substrate or substrates, depositing said layer on said substrate, monitoring the thickness of the layer formed in said perforation, determining the relationship between the thickness of the layer formed in said perforation and the thickness of the layer formed on the substrate surface, and stopping deposition when the thickness of the layer formed on said perforation is consistent with the formation of a layer of said desired thickness on said surface.

Figure 2:
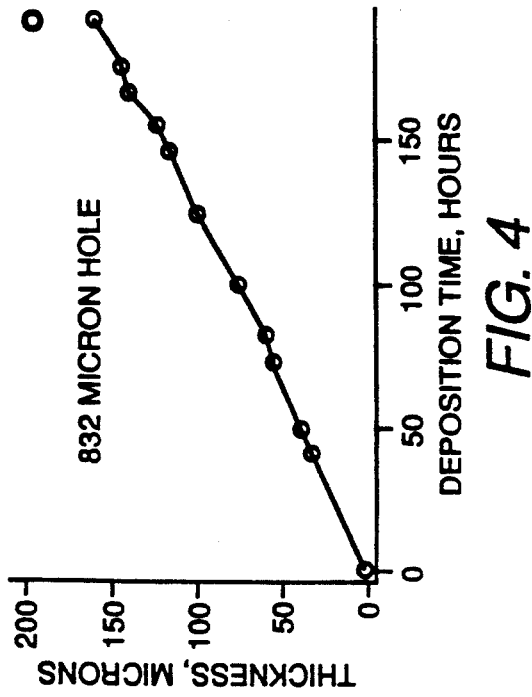
Figure 3:
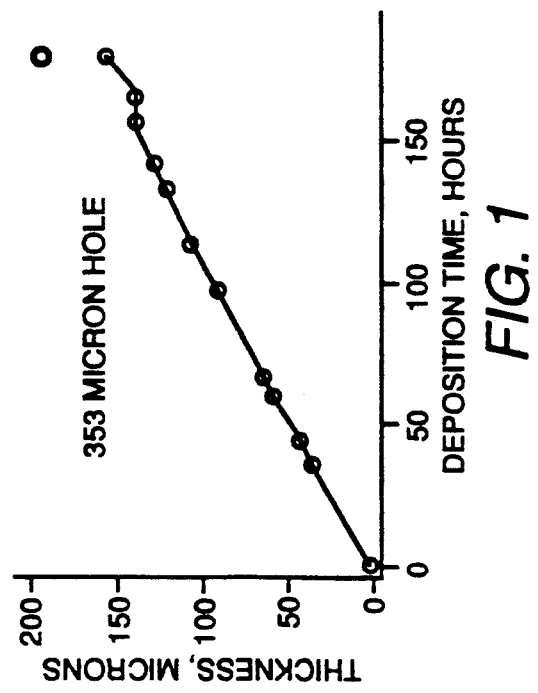
Figure 4:
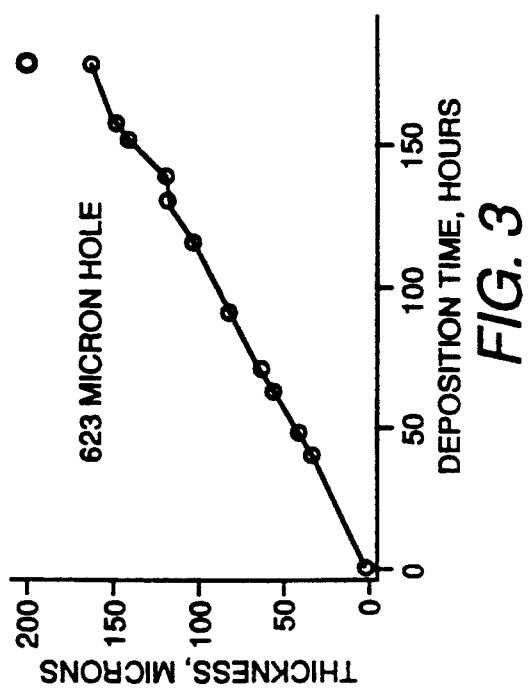

The drawings are graphs of the thicknesses of CVD diamond layers on the walls of holes of various diameters in a substrate, as a function of time of deposition. FIGS. 1-4 respectively correspond to hole diameters of 353, 469, 623 and 832 microns, as explained in more detail hereinafter.

The details of the CVD operation, as well as the equipment and materials used therein, need not be repeated here since they are well known in the art. For materials other than diamond, the process may involve the reaction between a metal (e.g., tungsten or rhenium) halide and hydrogen; for diamond, it involves the reaction of a hydrocarbon with atomic hydrogen. The essential items are a vessel in which the CVD operation is conducted, typically under reduced pressure; a substrate within said vessel on which the diamond is deposited, means for introducing the reactive gases into said vessel and into contact with the substrate, and activation means to create reactive conditions. In the case of diamond, a hot filament or microwave generator is typically employed for activation of the hydrogen-hydrocarbon mixture.

The method of the invention is particularly useful for diamond production, and will be described hereinafter in that context. It should be understood, however, that said method may also be applied to the CVD deposition of other materials.

According to the present invention, at least one substrate is mounted in the CVD apparatus so that one or more perforations exist in the plane thereof. The word "perforation" is used herein as defined in item 2a of *Webster's New Collegiate Dictionary*, 1981 edition; i.e., "a hole or pattern made by or as if by piercing or boring".

Thus, it is within the scope of the invention to employ a single substrate with at least one hole of predetermined size bored through it. Alternatively, a plurality of substrates may be mounted in the same plane, with spaces of known distance between them. Those skilled in the art will recognize that multiple substrates containing holes, as well as other equivalent embodiments, may also be employed.

If a hole is bored through the substrate, it may be circular or irregular (for example, elliptical) in shape, but there is usually no advantage in an irregular shape and a circular hole is therefore preferred. If desired, a plurality of holes of the same or different sizes may be created, to assist in determining the consistency of thickness of the diamond layer.

The dimensions and especially the diameter or width of the perforation are predetermined as described hereinafter so that the observed thickness of the CVD diamond layer formed in the perforation can be related to the thickness of the layer formed on the surface of the substrate. It is thus possible to monitor the appearance of the perforation during the CVD operation, and to discontinue deposition when the layer on the surface is of approximately the desired thickness.

In a relatively simple embodiment, the CVD operation is continued until the perforation is bridged. This is convenient when the size of the perforation is related to the desired thickness of the surface layer so that bridging occurs when said desired thickness has been reached. However, it is also contemplated to employ a larger perforation and to more closely monitor the thickness of the layer formed on the walls thereof which are at an angle to, and preferably perpendicular to, the surface.

Such monitoring may be visual, optionally assisted by such equipment as a video camera connected to monitoring (and, optionally, recording) means, whereby the perforation appears on a monitor, usually magnified, and its actual size may easily be determined. Alternatively, automated monitoring means may be employed. For example, it is possible to use a photocell in combination with computerized graphing equipment, which will show a sharp drop in transmitted light intensity at the time of closure of the perforation. Suitable equipment for this purpose will be readily apparent to those skilled in the art.

Monitoring of the perforation may be from back to front or from front to back. If it is from back to front, it may be convenient to locate the perforation opposite a heated filament if such a filament is employed, whereupon the light emitted by the filament will aid in determining when the perforation has been bridged. It is frequently more convenient, however, to monitor the perforation from front to back since it then appears as a dark spot on a light surface, rather than the opposite.

The dimensions and particularly the width of the perforation are an important factor in the operation of the invention. As a first approximation, it might be assumed that the width of the perforation should be at least twice the desired thickness of the diamond layer, since the layer produced in said perforation will grow on both sides at once. In practice, however, diamond growth is somewhat slower in the perforation than elsewhere on the substrate surface by reason of the necessity to fill said perforation, at least partially, with diamond.

The relationship between the width of a circular hole and the thickness of a diamond layer grown on a molybdenum substrate was determined in an apparatus which included a magnifying lens located a specific distance from the substrate, linked to a video camera which in turn fed a signal to a video cassette recorder (for data preservation) and a video monitor. The relationship of hole size to the size actually shown on the monitor was calculated precisely.

Four holes, with diameters of 353, 469, 623 and 832 microns, were bored through the substrate, which was then mounted in the CVD apparatus. Diamond deposition was initiated and the decrease in diameter of each hole was noted periodically. At the end of the deposition period of about 185 hours, the thickness of the diamond coating on the surface was determined.

It was found that the decreases in the sizes of the four holes were relatively consistent. It was further found that an actual thickness of about 211 microns on the surface corresponded to a thickness of about 163 microns on the hole walls.

This is shown in the drawings, each of which represents the thickness of the diamond layer deposited in a hole of the indicated thickness. The point in each figure not located on the curve is the thickness of the diamond layer on the surface at the conclusion of the deposition period. It is apparent that the diamond thickness on the hole walls is relatively consistent and independent of the diameter of the hole.

Thus, it was determined that, as a general rule, the width (diameter in the case of a circular hole) of the hole should be at least about 150–160% of the desired thickness of the diamond layer in order for the hole to be completely bridged or the diamond coating on the walls thereof measurable when the desired surface thickness is reached. In any individual CVD system, the relationship can be determined as necessary by simple experimentation.

In any event, precise accuracy is not necessary so long as monitoring of the thickness of the diamond layer in the perforation indicates that the diamond layer on the substrate is of at least the requisite thickness. It will then be possible to terminate the run within a reasonable time after said thickness has been attained, saving time and energy. Under most circumstances, it can be assumed that the rate of diamond deposition will be about 12 microns per day.

Another aspect of the present invention is an apparatus for chemical vapor deposition as described hereinabove. Said apparatus comprises:

an enclosure adapted to be maintained at a pressure and temperature suitable for chemical vapor deposition, feed means for feeding reagents suitable for chemical vapor deposition to said enclosure, at least one of reagent activation and temperature control means for maintaining chemical vapor deposition conditions in said enclosure, and at least one substrate in said enclosure, said substrate or substrates being adapted to receive a chemical vapor deposited layer and having at least one perforation of a predetermined size therein, said size having a determinable relation to the thickness of a layer of chemical vapor deposited material to be formed on the surface of said substrate.

Said apparatus may also comprise perforation monitoring means, of any of the types previously described, for aiding in determining the thickness of the diamond layer formed in said perforation, as by noting when it is bridged. Such means are essential when the perforation cannot be viewed from outside the enclosure.

What is claimed is:

1. A method for depositing a layer of material of a specific desired thickness on the surface of at least one substrate by chemical vapor deposition which comprises:

mounting said substrate or substrates in chemical vapor deposition apparatus so that at least one perforation exists in the plane of said substrate or substrates, depositing said layer on said substrate by chemical vapor deposition, monitoring the thickness of the layer formed in said perforation, determining the relationship between the thickness of the layer formed in said perforation and the thickness of the layer formed on the substrate surface, and stopping deposition when the thickness of the layer formed on said perforation is consistent with the formation of a layer of said desired thickness on said surface.

2. A method according to claim 1 wherein the material being deposited is diamond.

3. A method according to claim 2 wherein a single substrate is employed and the perforation is a hole in said substrate.

4. A method according to claim 3 wherein the hole is circular.

5. A method according to claim 2 wherein a plurality of substrates are mounted in the same plane with spaces of known distance between them.

6. A method according to claim 2 wherein the width of said perforation is at least about 150–160% of the desired thickness of the diamond layer.

7. A method according to claim 2 wherein the size of said perforation is related to the desired thickness of the diamond layer such that bridging of said perforation occurs when said desired thickness has been reached.

* * * * *